United States Patent [19]

Endo et al.

[11] 4,369,469

[45] Jan. 18, 1983

[54] CHARGE TRANSFER APPARATUS

[75] Inventors: Yukio Endo; Okio Yoshida, both of Yokohama, Japan

[73] Assignee: Tokyo Shibaura Denki Kabushiki Kaisha, Kawasaki, Japan

[21] Appl. No.: 226,904

[22] Filed: Jan. 21, 1981

[30] Foreign Application Priority Data

Jan. 25, 1980 [JP] Japan .................................. 55-6968
Feb. 21, 1980 [JP] Japan .................................. 55-19710

[51] Int. Cl.³ .......................... H04N 3/14; H04N 5/30
[52] U.S. Cl. .................................. 358/213; 358/167
[58] Field of Search ................... 358/213, 167; 357/24, 357/30; 250/211 J, 578

[56] References Cited

U.S. PATENT DOCUMENTS

| 4,274,113 | 6/1981 | Ohba | 358/213 |
| 4,298,887 | 11/1981 | Rode | 358/213 |
| 4,317,134 | 2/1982 | Woo | 358/213 |

FOREIGN PATENT DOCUMENTS 53-38902 10/1978 Japan .
51-45453 12/1976 Japan .
54-35732 11/1979 Japan .

Primary Examiner—Michael A. Masinick
Attorney, Agent, or Firm—Oblon, Fisher, Spivak, McClelland & Maier

[57] ABSTRACT

A charge transfer apparatus comprises a pulse generator, a drive circuit for sending forth drive signals having a plurality of voltage levels in accordance with the pulse signals produced from the pulse generator, and a charge coupled device of the frame transfer type which is actuated by the drive signals and in which bias charges are previously injected into the potential wells of the light receiving section. The drive circuit comprises an analog multiplexer for selectively sending forth a D.C. voltage signal in accordance with the pulse signal, during the vertical blanking period, injects an excess amount of bias charges into the potential wells and raises the bottoms of the potential wells to let an excess amount of bias charges overflow the potential wells for combination with holes.

5 Claims, 36 Drawing Figures

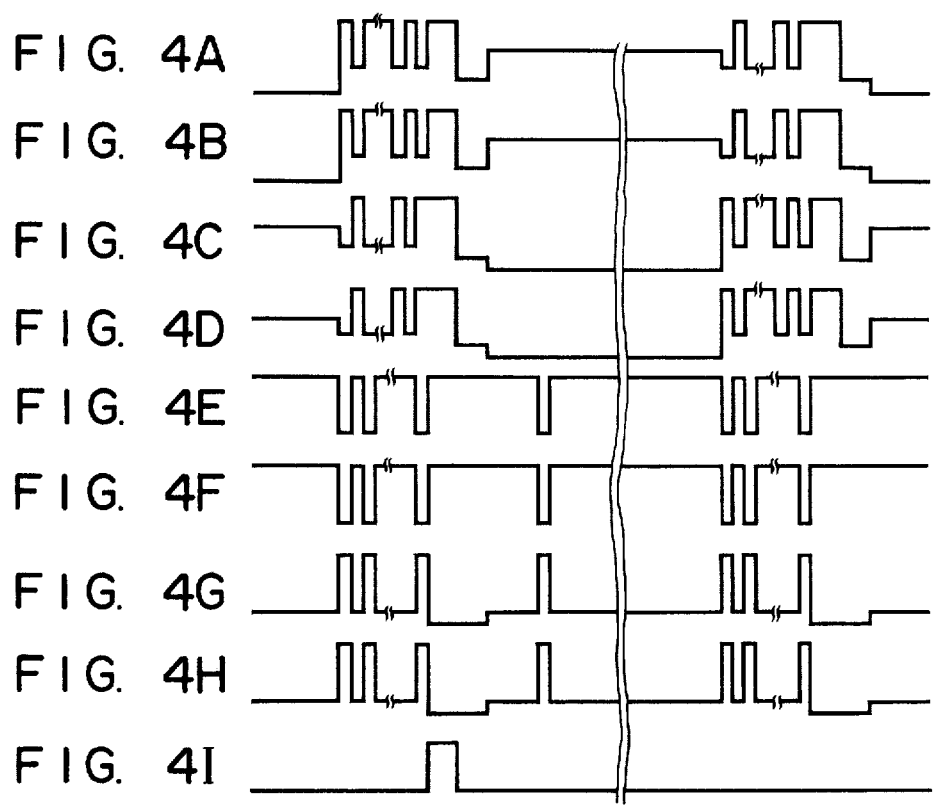

F I G. 5A
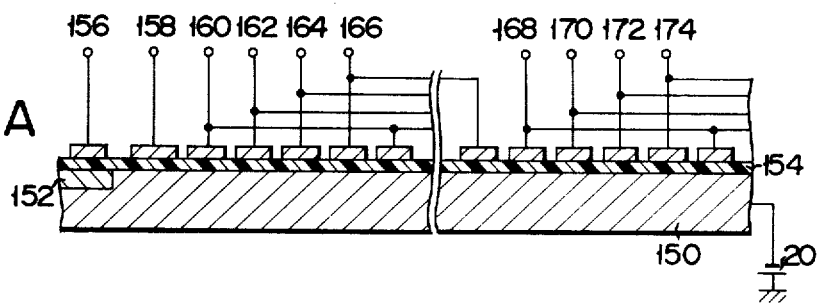
F I G. 5B
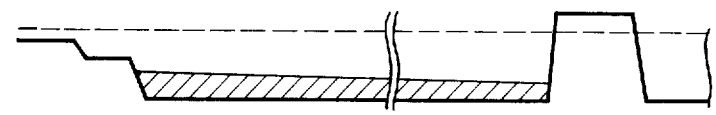
F I G. 5C
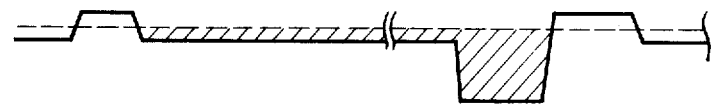
F I G. 5D
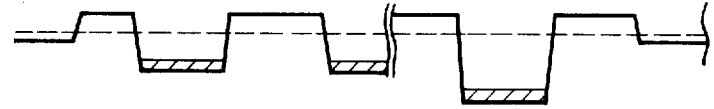

CHARGE TRANSFER APPARATUS

This invention relates to a charge transfer apparatus and more particularly to a charge transfer apparatus ensuring a high charge-transferring efficiency.

In recent years, a charge-coupled device (hereinafter abbreviated as "CCD") or bucket brigade device (hereinafter abbreviated as "BBD") is used as an image pickup device. The most important property of an image pickup device using a charge transfer element is the efficiency of transferring a signal charge. Particularly with a solid state image pickup device using the CCD of the frame transfer type, signal charges proportional to the luminosities of optical images stored in potential wells formed under charge transfer electrodes are sent forth through different numbers of charge transfer electrodes. Therefore, such solid state image pickup device is demanded to have a high charge transfer efficiency. A solid state image pickup device having a low charge transfer efficiency fails to transfer a minute charge. In other words, where a charge transfer element used with an image pickup device has a low charge transfer efficiency, then the following drawbacks appear:

A. A decline arises in the resolution of an image and the uniformity of resolution within a screen.

B. Irregularities in the light sensitivity occur on the screen.

C. It is impossible to pick up an image, where an input light has a small amount.

D. A false signal appears.

The conventional process of improving charge transfer efficiency comprises supplying potential wells formed under charge transfer electrodes with bias charges (referred to as "Fat Zero"), instead of signal charges to prevent an apparent loss of a signal charge. The bias charges are supplied by an optical or electric process. The optical process comprises irradiating a bias light on the light receiving section of the CCD, e.g. from a red LED (light emitting diode). However, the uniform supply of Fat Zero makes it necessary to evenly irradiate a bias light on the light receiving section by applying a special optical system. Therefore, the above-mentioned optical process is unadapted for a solid state image pickup device which has to be rendered compact, and moreover presents difficulties in reducing power consumption, changes with time in the property and manufacturing cost.

The electric process generally comprises providing input diodes and input gate electrodes at one end of the light receiving section of the CCD, thereby always supplying the potential wells with fixed bias charges. With the CCD of the frame transfer type, different threshold voltages depending on the positions of input diodes and input gates lead to variations in an amount of bias charges to be supplied to the potential wells. To avoid such drawback, a process was disclosed in the Japanese patent publication No. 35732 (1979) which impresses the light receiving section with such a voltage as reduced the depth of the potential wells and overflowed bias charges to reduce bias charges during the charge integration period before supplying the light receiving section with a pulse for causing the section to integrate charges, thereby fixing charges left in the potential wells.

With the proposed process, however, the bottom of a potential well is apparently raised during the charge integration period. Therefore, charges overflowing a potential well undesirably leak to a bias charge injection section and storing section. As a result, a decrease appears in bias charges under the charge transfer electrodes of those portions of the light receiving section which lie near the bias charge injection section and storing section, resulting in the irregularities of signal charges in the charge transfer electrodes, that is, the occurrence of an ugly image.

Ringing appearing in the waveform of clock pulse signals supplied to the electrodes of the CCD also adversely affects charge transfer efficiency. The conventional clock pulse generator in which the amplitude of clock pulses is determined by controlling a voltage to be applied to the collector of a transistor. Therefore, a response is delayed, and consequently ringing is occurred. Such event results in a decrease in signal charges which should be stored in a potential well and a fall in charge transfer efficiency. Further, the clock pulses vary in amplitude with an operation mode such as a charge integration mode or charge transfer mode. This event results in changes in an operating point of a transistor and in a rising time of the clock pulse signal, eventually leading to a decline in charge transfer efficiency.

It is accordingly the object of this invention to provide a charge transfer apparatus which ensures a uniform injection of bias charges and consequently a high charge transfer efficiency.

To attain the above-mentioned object, this invention provides a charge transfer apparatus which comprises:

a charge transfer element formed of a bias charge injection section, light receiving section and storing section;

a generator of pulse signals which determine timings in which the operation modes of the charge transfer element are determined; and a drive circuit connected to the charge transfer element and pulse generator, which includes a voltage source for issuing D.C. voltage signals to define the depths of potential wells of the charge transfer element, supplies D.C. voltage signals delivered from the voltage source to the charge transfer electrodes of the charge transfer element in accordance with the output signal from the pulse generator, and, before the charge integration mode of the light receiving section, sends forth to the bias charge injection section a signal for causing bias charges to be injected into the potential wells of the light receiving section and issues to the charge transfer electrodes of the light receiving section a signal for causing the bottoms of the potential wells of the light receiving section to be uniformly raised.

This invention can be more fully understood from the following detailed description when taken in conjunction with the accompanying drawings, in which.

FIGS. 3A to 3E collectively indicate a time chart showing a timing in which clock pulses are sent forth from a pulse generator;

FIGS. 4A to 4I collectively illustrate a time chart showing a timing in which drive pulse signals are supplied to the CCD;

FIGS. 5A to 5D show changes in the depths of a potential wells of a charge transfer element and an amount of bias charges stored therein;

FIGS. 6A to 6D collectively indicate a timing chart of drive pulse signals according to a second embodiment of the invention;

FIGS. 7A to 7D illustrate changes in the depths of the potential wells of the charge transfer element and an amount of a bias charge stored therein;

FIGS. 8A to 8D collectively show a time chart of drive pulse signals according to a third embodiment of the invention; and FIGS. 9A to 9D illustrate changes in the depths of the potential wells of the charge transfer element and an amount of bias charges stored therein.

Figure 1:
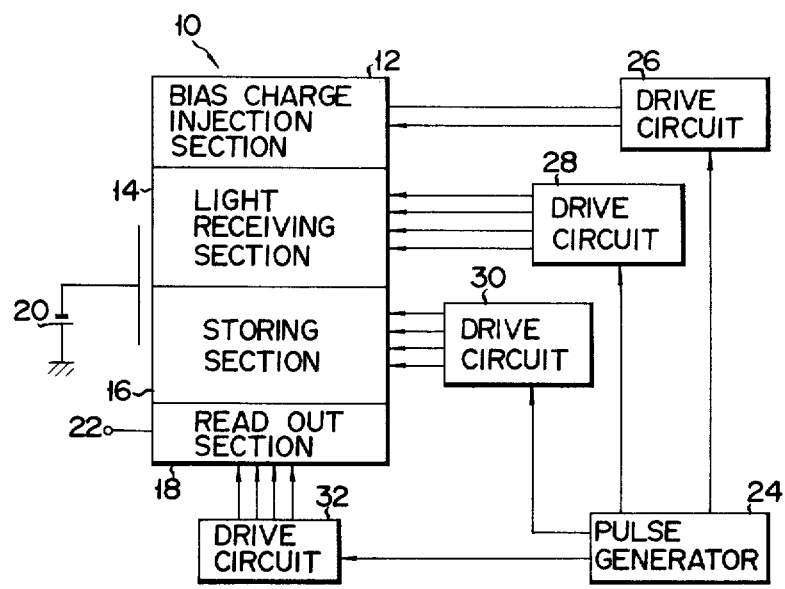
FIG. 1 is a block circuit diagram of a charge transfer apparatus according to a first embodiment of this invention.

Description is now given of a charge transfer apparatus according to a first embodiment of this invention with reference to FIG. 1 showing a block circuit diagram. With this first embodiment, a charge transfer element is chosen to be a frame transfer type CCD of requiring 4-phase clock pulse. The CCD 10 is formed of a bias charge injection section 12, light receiving section 14, storing section 16 and read out section 18. The bias charge injection section 12 comprises input diodes and input gates. The light receiving section 14 alone is exposed to light. Electrodes are arranged in a two-dimensional form for the light receiving section 14 and storing section 16. In contrast, electrodes are provided in a single dimensional form for the read out section 18. With the bias charge injection section 12, too, electrodes are provided in a single dimensional form in parallel with each other for the input diodes and input gates. The electrodes of the first to the fourth phase electrodes of both light receiving section 14 and storing section 16 are respectively arranged in a single dimensional form in parallel with each other. The substrate of the CCD 10 is connected to a negative terminal of a D.C. source 20. The read out section 18 has an output terminal 22.

Output signals from a pulse generator 24 are supplied to drive circuits 26, 28, 30 and 32. The first output terminal of the drive circuit 26 is connected to the diode terminals of the bias charge injection section 12. The second output terminal of the drive circuit 26 is connected to the gate terminals of the bias charge injection section 12. The first to the fourth output terminals of the drive circuits 28, 30 and 32 are respectively connected to the first to the fourth phase transfer electrodes of the light receiving section 14, storing section 16 and read out section 18.

Figure 2:
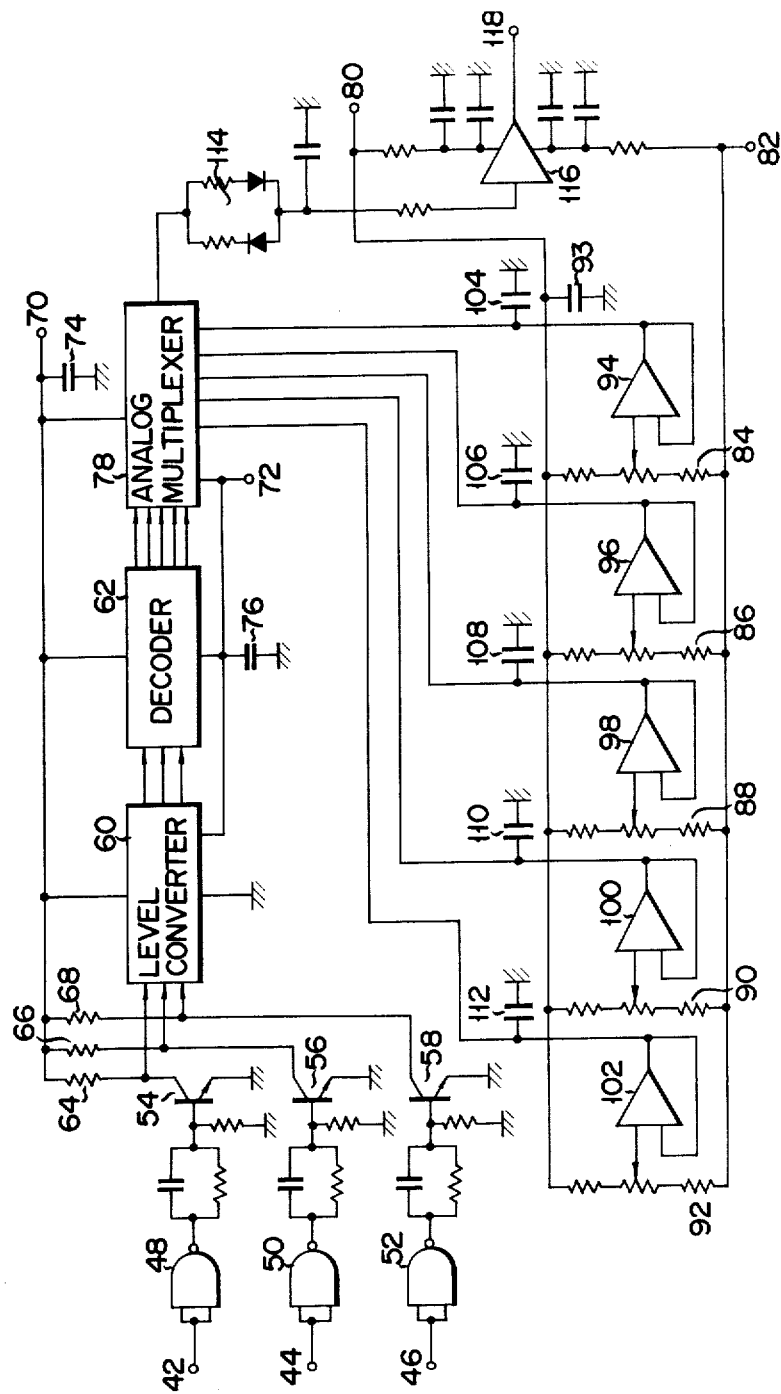
FIG. 2 shows the arrangement of the main part of the drive circuit of the first embodiment of FIG. 1.
Figure 6A:
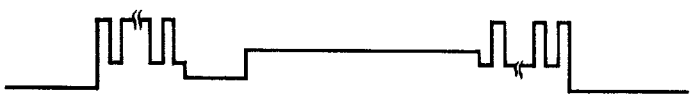
Figure 6B:
Figure 6C:
Figure 6D:

The drive circuit 28 comprises four drive sections of the respective phases which are of the same arrangement. Therefore, FIG. 2 only shows the arrangement of the drive section of, for example, the first phase. The first to the third input terminals 42, 44 and 46 of the drive circuit 28 are connected through the corresponding inverters 48, 50 and 52 to the bases of NPN type transistors 54, 56 and 58, the emitters of which are grounded. The collectors of the transistors 54, 56 and 58 are connected through a level converter 60 to the first to the third input terminals of a 2 to 10 scale decoder 62. The collectors of the transistors 54, 56 and 58 are connected to a power supply terminal 70 of 15 V through the corresponding resistors 64, 66 and 68. The level converter 60 is connected to the power supply terminal 70 and a power supply terminal 72 of −5 V. The power supply terminals 70 and 72 are grounded through the corresponding capacitors 74 and 76. The decoder 62 has eight output terminals, five of which are connected to the corresponding five input terminals of an analog multiplexer 78. This analog multiplexer 78 has five switching elements, only one of which is selectively rendered conducting upon receipt of an input signal to produce an input signal of the selected switching element as an output signal. The power supply terminals 70 and 72 also connected to the decoder 62 and analog multiplexer 78.

Variable resistor circuits 84, 86, 88, 90 and 92 are connected in parallel between a power supply terminal 80 of 20 V and a power supply terminal 82 of −10 V. The power supply terminal 80 is grounded through a capacitor 93. The taps of the variable resistor circuits 84, 86, 88, 90 and 92 are connected to the corresponding comparators 94, 96, 98, 100 and 102 at one input terminal thereof. The output terminals of the comparators 94, 96, 98, 100 and 102 are connected to the other input terminals of their own, and also to the input terminals of the first to the fifth switching elements of the analog multiplexer 78. The output terminals of the comparators 94, 96, 98, 100 and 102 are grounded through capacitors 104, 106, 108, 110 and 112, respectively. The output terminal of the analog multiplexer 78 is connected to the output terminal 118 of the drive circuit through a wave shaping circuit 114 and drive amplifier 116. The output terminal 118 is connected, for example, to the first phase transfer electrodes of the light receiving section 14. The drive circuit 30 has the same arrangements as the drive circuit 28. The analog multiplexer of the drive circuit 30 has two or three switching elements. The drive circuits 26 and 32 convert the level of an output signal from the pulse generator 24.

Description is now given of the operation of a charge transfer apparatus according to the first embodiment of this invention. First, reference is made to the actuation of the drive circuit 28 for the light receiving section 14. The period during which the CCD 10 of the frame transfer type is operated is broadly divided into a signal charge integration period and a vertical blanking period. The vertical blanking period includes a frame transfer period. A signal charge integration period includes a period during which the potential wells formed under the first and second phase electrodes integrate signal charges and a period during which the potential wells formed under the third and fourth phase electrodes integrate signal charges. These two signal charge integration periods alternately take place with the vertical blanking period recurring therebetween. In other words, an image of one frame is picked up in two periods. Those of the potential wells of the light receiving section which do not integrate signal charges during the integration period are referred to as "remaining in an accumulation mode".

Figure 3A:
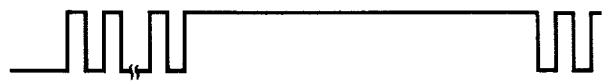
Figure 3B:
Figure 3C:

The first to the third input terminals 42, 44 and 46 of the drive circuit 28 are respectively supplied with signals shown in FIGS. 3A to 3C. The first input terminal of each of the third and fourth phase drive sections is supplied with a pulse signal having the opposite polarity to that of FIG. 3A. A pulse signal of FIG. 3A is used to transfer a frame during a frame transfer period. A pulse signal of FIG. 3C is sent forth by the pulse generator 24 during the vertical blanking period. An output pulse signal from the pulse generator 24 has a TTL level. A low TTL level is converted to a zero volt and a high TTL level is converted to 15 V by the transistors 54, 56 and 58. Further, the low level of this signal is converted by the level converter 60. The level-converted signal is supplied to the decoder 62. Therefore, the first to the third input terminals of the decoder 62 are respectively supplied with signals obtained by converting the levels of the signals shown in FIGS. 3A to 3C.

The output terminals of the comparators 94, 96, 98, 100 and 102 are respectively impressed with voltages having ACC level, INT level, FTL level, FTH level and VBC level in accordance with the resistances of the variable resistor circuits 84, 86, 88, 90 and 92. The ACC level and INT level respectively denote voltage levels for setting the potential wells of the light receiving section 14 at an accumulation mode and integration mode. The FTL level and FTH level respectively represent voltage levels for defining the low and high levels of the amplitudes of frame transfer pulse signals supplied to the transfer electrodes during the frame transfer period. The VBC level is higher than a reference level and lower than the FTL level. As counted from the higher levels, the aforesaid five levels assume the order of FTH, INT, FTL, VBC and ACC.

Output signals from the analog multiplexer 78 are chosen to have such levels as listed in Table 1 below in accordance with the levels of the first to the third input signals to the decoder 62.

TABLE 1

| Input terminals | | | |
|---|---|---|---|
| 1st | 2nd | 3rd | Output signals |
| L | L | L | ACC |
| H | H | L | FTH |
| L | H | L | FTL |
| H | L | H | VBC |
| H | L | L | INT |

The driver circuit 28 supplies signals shown in FIGS. 4A to 4D respectively to the first to the fourth phase transfer electrodes of the light receiving section 14.

Figure 3D:
Figure 3E:

The pulse generator 24 supplies signals shown in FIGS. 3D and 3E respectively to the first and second input terminals of the drive circuit 30. At this time, the first input terminals of the third and fourth phase drive sections are supplied with a phase signal having the opposite polarity to that of a signal shown in FIG. 3D.

Output signals from the analog multiplexer of the drive circuit 30 have such levels as listed in Table 2 below in accordance with the levels of the first and second input signals to the drive circuit 30.

TABLE 2

| Input terminals | | |
|---|---|---|
| 1st | 2nd | Output signals |
| L | L | FTH |
| H | L | FTL |
| L | H | FTH |
| H | H | ACC |

The drive circuit 30 supplies signals shown in FIGS. 4E to 4H respectively to the first to fourth phase transfer electrodes of the storing section 16.

The pulse generator 24 respectively supplies a high level signal and a phase signal shown in FIG. 4I to the diodes and the gates of the charge injection section 12 through the drive circuit 26.

Description is now given with reference to FIGS. 5A to 5D of the operation of the CCD 10 when it is supplied with pulse signals shown in FIGS. 4A to 4I. FIG. 5A is a longitudinal sectional view of the CCD 10 extending from the bias injection section 12 to the read out section 18. FIGS. 5B, 5C and 5D schematically illustrate changes in the depth of the potential wells formed under the electrodes of the device shown in FIG. 5A and the manner in which a bias charge is injected into the potential wells. Throughout FIGS. 5B to 5D, solid lines defines a potential well, a broken line represents a reference level and hatchings indicate the bias charge. In FIG. 5A, a P type semiconductor substrate 150 is connected to a negative terminal of the D.C. source 20. An N type layer 152 is formed on the surface area of the P type semiconductor substrate 150. A silicon oxide film 154 is deposited on the surface of the P type semiconductor substrate 150 and that of the N type layer 152. A large number of polysilicon electrodes are mounted on the surface of the silicon oxide film 154. The polysilicon electrodes formed on the surface of the N type layer 152 are connected to an input diode terminal 156. An electrode adjacent to input diode terminal 156 is connected to a gate terminal 158. The electrodes of the first to the fourth phases used with the light receiving section 14 are respectively connected to transfer terminals 160, 162, 164 and 166 of the first to the fourth phase. The electrodes of the first to the fourth phases used with the storing section 16 are respectively connected to transfer terminals 168, 170, 172 and 174. A high level signal is supplied to the diode terminal 156. A pulse signal shown in FIG. 4I is supplied to the gate terminal 158. Pulse signals shown in FIGS. 4A to 4H are respectively supplied to transfer terminals 160, 162, 164, 166, 168, 170, 172 and 174.

The initial sub-period of the vertical blanking period relates to the frame transfer. During this sub-period of the vertical blanking period, signal charges integrated in the potential wells during the integration period are transferred to the storing section 16. Where the frame transfer period is brought to an end, then the transfer electrodes of the light receiving section 14 are respectively supplied with signals having the FTH level shown in FIGS. 4A to 4D. Therefore the potential wells formed under the bias charge transfer electrodes are set at the integration mode as shown in FIG. 5B. Signals having the FTH level shown in FIGS. 4E and 4F are supplied to the transfer electrodes of the first and second phases of the storing section 16. Consequently, the potential wells under the transfer electrodes of the first and second phases of the storing section 16 are set at the integration mode. Signals having the ACC level shown in FIGS. 4G and 4H are respectively supplied to the transfer electrodes of the third and fourth phases of the storing section 16. As a result, the potential wells under the electrodes of the third and fourth phases are set at the accumulation mode. Namely, the bottom of the potential well is raised acts as a barrier to the bias charges. The gate electrode is supplied with a voltage signal having a higher level than the reference level shown in FIG. 4I. As a result, the gate is opened to allow bias charges to be injected into a potential well from the input diode 152. In this case, however, the bias charges are much collected in the proximity of the injection portion of the potential well. The injected amount of the bias charges progressively decreases toward the storing section, that is, giving rise to irregularities in the injected amount of bias charges.

Where a signal shown in FIG. 4I falls, then the bottom of the potential well under the gate electrode is raised above the reference level (as shown in FIG. 5C), indicating the so-called accumulation mode, thereby forming a barrier. Signals supplied to the storing section 16 have the same level as in the immediately preceding period. However, signals supplied to the electrodes of the light receiving section 14 are all made to have the VBC level shown in FIGS. 4A to 4D. As a result, the bottoms of the potential wells under the respective electrodes of the light receiving section 14 are raised above the reference level, thus presenting the so-called accumulation mode. Consequently, part of the stored bias charges overflow the potential wells whose bottoms are thus raised. The overflowing bias charges are combined with holes in the semiconductor substrate. As a result, a uniform amount of bias charges is retained in the potential wells formed under the electrodes of the light receiving section 14.

When the vertical blanking period is brought to an end, then the transfer electrodes of the first and second phases of the light receiving section 14 respectively have the INT level shown in FIGS. 4A and 4B. At this time, the transfer electrodes of the third and fourth phases of the light receiving section 14 respectively have the ACC level shown in FIGS. 4C and 4D. As shown in FIG. 5D, therefore, potential wells under the transfer electrodes of the first and second phases are set at the integration mode. The potential wells under the transfer electrodes of the third and fourth phases are set at the accumulation mode. Thereafter, the signal charge integration period ensues.

With the foregoing embodiment, a larger amount of bias charges than required is injected into a potential well as described above. Thereafter, the bottoms of the potential wells under the transfer electrodes of the light receiving section 14 are uniformly raised by supplying a signal having the VBC level to the electrodes, thereby letting an excess amount of bias charges overflow the potential wells. This process makes it possible eventually to inject a uniform amount of bias charges into the potential wells. The amplitude of the drive pulse can be accurately controlled due to application of the analog multiplexer, thereby suppressing the occurrence of ringing at the rise of a pulse signal, and consequently ensuring a high charge transfer efficiency. Further, negative D.C. voltage 20 is impressed on the semiconductor substrate 150. Consequently, a depletion layer is always produced in the semiconductor substrate 150 during the frame transfer period, elevating the charge transfer efficiency. It is also possible to reduce the occurrence of vertical smears during the frame transfer period. Since the bias charges are injected during the vertical blanking period, frame transfer pulses from the pulse generator 24 can be utilized, making it unnecessary to generate fresh clock pulses. What is required is that pulse signals shown in FIGS. 3A to 3C be sent forth within the vertical blanking period of 1.25 milliseconds. In this connection, it will be noted that the frame transfer period shown in FIG. 3A is defined by a product arrived at by multiplying the frequency of a frame transfer pulse signal by the frequency of frame transfers. In the case of an image pickup apparatus using the frame transfer type CCD formed of 256 (V) × 340 (H) picture elements, a degree of resolution does not fall, even if a frame transfer frequency is set at as high a level as 500 KHz. In this case, a frame transfer period is indicated as 2 $\mu s \times 256 = 512$ $\mu s$. A length of time extending from a point of time at which the frame transfer period is brought to an end to a point of time at which the period shown in FIG. 3B is brought to an end, that is a length of time for which the gate is left open is chosen to be 50 $\mu s$ in consideration of the stability with which a charge transfer apparatus embodying this invention should be operated. A pulse period shown in FIG. 3C, that is, a length of time for which the bottoms of potential wells remain raised is defined by a time constant required for an excess amount of bias charges to be combined with holes. It is experimentally proved that 500 $\mu s$ well serves the purpose. A total of the above-mentioned three periods, that is, 512 $\mu s + 50$ $\mu s + 500$ $\mu s = 1,062$ $\mu s$ is shorter than the vertical blanking period of 1.25 milliseconds. Therefore, an injection of bias charge into a potential well is completed within the vertical blanking period.

With the foregoing embodiment, a period during which bias charges are injected into a potential well from the input diodes through the opened input gates was chosen to start after the frame transfer period was brought to an end. However, the bias charge injection period may be started during the frame transfer period. In the latter case, injected bias charges are transferred from one potential well to another, and spread throughout the light receiving section 14. Thereafter it is advised to raise the bottoms of potential wells above the reference level as shown in FIG. 5C.

Figure 7A:
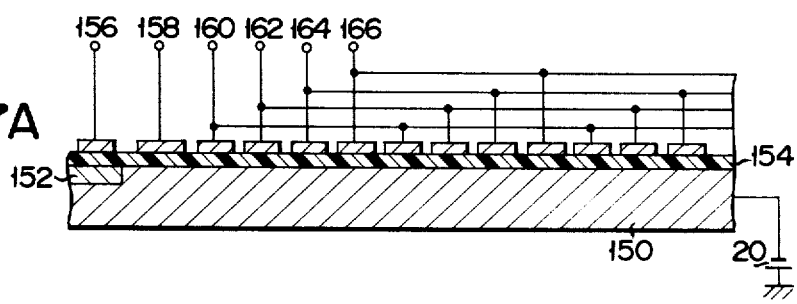
Figure 7B:
Figure 7C:
Figure 7D:
Figure 8A:
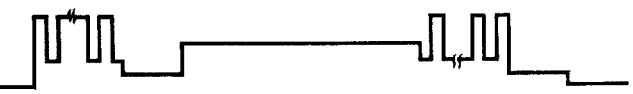
Figure 8B:
Figure 8C:
Figure 8D:
Figure 9A:
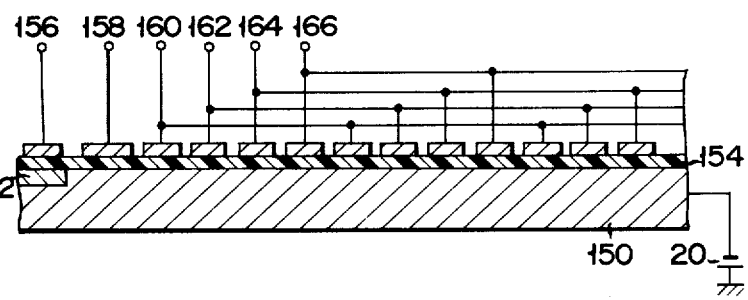
Figure 9B:
Figure 9C:
Figure 9D:
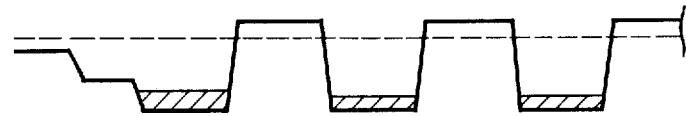

Description is now given of a charge transfer apparatus according to a second embodiment of this invention. With this second embodiment, different pulse signals from those used in the first embodiment are applied for injection of bias charges into potential wells. FIGS. 6A to 6D respectively illustrate pulse signals supplied to the electrodes of the first to the fourth phases of the light receiving section 14. The gate electrode is always supplied with a D.C. voltage having a higher level than the reference level. FIGS. 7A to 7D correspond to FIGS. 5A to 5D. Description is given with reference to FIGS. 7A to 7D of the operation of a charge transfer apparatus according to the second embodiment of the invention. The gate is always opened. As shown in FIG. 7B, bias charges are injected into potential wells during the frame transfer period. Injected bias charges are conducted through potential wells one after another. Where the frame transfer period is brought to an end, then a signal having the ACC level is supplied to the electrodes of two optional phases (of the third and fourth phases in this embodiment) of the light receiving section 14. A signal having the VBC level is supplied to the electrodes of the other phases (the first and second phases in this embodiment) to raise the bottoms of potential wells under the electrodes above the reference level as shown in FIG. 7C. Since the potential wells under the electrodes of the third and fourth phases are set at the accumulation mode, an overflowing excess amount of bias charges can be efficiently combined with holes. As a result, bias charges are uniformly retained in the potential wells. The arrangement of the second embodiment makes it unnecessary to provide a bias charge storing period and a barrier under the gate electrode. Therefore, the input gate electrode has only to be supplied with a signal of D.C. level, thereby simplifying the arrangement of a drive circuit. During the signal charge integration period, signal charges are integrated in the potential wells under the electrodes of the first and second phases. Not only the signal charges but also bias charges are collected in the potential wells under the electrodes of the first and second phases adjacent to the gate. However, the resultant picture elements do not take part in the actual pickup of an image, and can be neglected. The two phases related to the raising of the bottom of potential wells and the two phases related to the accumulation mode may be grouped in a different manner from that described above.

The electrodes whose underlying potential wells are set at the accumulation mode when the bottoms of potential wells are raised above the reference level need not be restrictively grouped into those of two phases. It is possible to let potential wells under the electrodes of three phases respectively be set at the integration mode and potential wells under the electrodes of another phase be set at the accumulation mode.

Description is now given with reference to FIGS. 8A to 8D and FIGS. 9A to 9D of a charge transfer apparatus according to a third embodiment of this invention. The light receiving section is supplied with signals shown in FIGS. 8A to 8D. As indicated, the electrodes of the first to the third phases are set at the VBC level for the integration mode when the frame transfer period is brought to an end. The electrodes of the fourth phase are set at the ACC level for the accumulation mode. As a result, bias charges overflowing the potential wells under the electrodes of the first to the third phases are combined with holes in those portions of the semiconductor substrate which lie under the electrodes of the fourth phase. With the above-mentioned third embodiment of this invention, too, the electrodes whose underlying potential wells are set at the accumulation mode need not be restricted to have the aforesaid phases. Though not shown, it is possible to let bias charges be stored in potential wells under electrodes of a given phase, and set the potential wells under the electrodes of the other three phases at the accumulation mode. Further, injection of bias charges may be controlled by varying a level of voltage impressed on the input diode, instead of actuating the input gate. In this case, an amount of bias charges injected into potential wells is determined by the VBC level of the drive signal. However, this VBC level need not be set at a fixed value. A pulse signal, for example, may have its level progressively decreased, starting with a point of time at which bias charges are injected into potential wells. Where a positive D.C. voltage is impressed on a semiconductor substrate when the bottoms of potential wells under the electrodes are raised by supplying a drive signal of the VBC level to the electrodes, then the semiconductor substrate is set at the accumulation mode, ensuring the efficient combination of bias charges with holes.

All the above-mentioned embodiments relate to the application of the frame transfer type CCD. However, it is possible to use the CCD of an interline transfer type, and also apply the BBD as a charge transfer element instead of the CCD.

What we claim is:

1. A charge transfer apparatus comprising:
    a bias charge transfer element formed of a bias charge injection section, light receiving section and storing section;
    means for producing pulse signals for defining timings in which the operation modes of the charge transfer element are carried out; and
    drive means connected to the charge transfer element and pulse generating means, which includes a voltage source for sending forth D.C. voltage signals to define the depths of potential wells of said charge transfer element, supplies D.C. voltage signals to the respective electrodes of said charge transfer element in accordance with the pulse signals produced from said pulse generating means, before the charge integration mode of the light receiving section, sends forth to the bias charge injection section a signal for causing bias charges to be injected into potential wells of the light receiving section and thereafter supplies the electrodes of the light receiving section with a signal for causing the bottoms of potential wells to be uniformly raised.

2. The charge transfer apparatus according to claim 1, wherein said drive means comprises a decoder connected to the output terminal of the pulse generating means, and an analog multiplexer including switches whose switch input terminals are connected to the output terminals of the voltage source, and selectively closes only one of the switches in accordance with the output signal from the decoder to send forth a D.C. voltage signal.

3. The charge transfer apparatus according to claim 1, wherein said charge transfer element is of a frame transfer type and said pulse generating means sends forth a pulse signal for changing over the operation of said charge transfer element from a signal charge integration period to the vertical blanking period or vice versa, and further sends forth a pulse signal for frame transfer of charges during the vertical blanking period.

4. The charge transfer apparatus according to claim 3, wherein the charge injection section of said charge transfer element includes a diode electrode and gate electrode and said drive means, during a period extending from a point of time at which the frame transfer period is brought to an end to a point of time at which the signal charge integration period is commenced, causes the potential wells under all the electrodes of the light receiving section to have the same depth, injects an excess amount of bias charges into the potential wells, sets the potential wells under the gate electrodes and the electrodes of the storing section at the accumulation mode, uniformly raises the bottom of the potential wells and causes part of the bias charges to overflow the potential wells whose bottoms are raised, for combination with holes.

5. The charge transfer apparatus according to claim 3, wherein said drive means injects an excess amount of bias charges into the potential wells during the frame transfer period, sets the potential wells under the prescribed electrodes of the light receiving section, uniformly raises the bottoms of the potential wells under the remaining electrodes of the light receiving section and causes part of the bias charges to overflow the potential wells for combination with holes during a period extending from a point of time at which the bias charge frame transfer period is brought to an end to a point of time at which the light beam integration period is commenced.

* * * * *